US010177738B2

(12) United States Patent
Miyamoto

(10) Patent No.: US 10,177,738 B2
(45) Date of Patent: Jan. 8, 2019

(54) ELASTIC WAVE DEVICE

(71) Applicant: Murata Manufacturing Co., Ltd., Nagaokakyo-shi, Kyoto-fu (JP)

(72) Inventor: Koji Miyamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 73 days.

(21) Appl. No.: 15/367,219

(22) Filed: Dec. 2, 2016

(65) Prior Publication Data

US 2017/0085248 A1 Mar. 23, 2017

Related U.S. Application Data

(63) Continuation of application No. PCT/JP2015/062398, filed on Apr. 23, 2015.

(30) Foreign Application Priority Data

Jun. 10, 2014 (JP) .................................. 2014-119580

(51) Int. Cl.
*H03H 9/25* (2006.01)
*H03H 9/64* (2006.01)
(Continued)

(52) U.S. Cl.
CPC .............. *H03H 9/25* (2013.01); *H03H 9/059* (2013.01); *H03H 9/1071* (2013.01);
(Continued)

(58) Field of Classification Search
CPC ........................................................ H03H 9/25
(Continued)

(56) References Cited

U.S. PATENT DOCUMENTS 6,891,450 B2 * 5/2005 Nakamura ........... H03H 9/0038
310/313 D
2002/0196104 A1 12/2002 Nako et al.
(Continued)

FOREIGN PATENT DOCUMENTS

CN 1389982 A 1/2003
JP 2003-069384 A 3/2003
(Continued)

OTHER PUBLICATIONS

Official Communication issued in corresponding International Application PCT/JP2015/062398, dated Jun. 30, 2015.

*Primary Examiner* — Stephen E. Jones
*Assistant Examiner* — Samuel S Outten
(74) *Attorney, Agent, or Firm* — Keating & Bennett, LLP

(57) ABSTRACT

An elastic wave device includes a longitudinally-coupled resonator surface acoustic wave filter including first to third IDTs and a parallel trap including a surface acoustic wave resonator. The longitudinally-coupled resonator surface acoustic wave filter is asymmetric with respect to a central axis of the second IDT, the central axis extending in a direction perpendicular or substantially perpendicular to the elastic-wave propagation direction on the piezoelectric substrate. When the duty ratio of an IDT of the surface acoustic wave resonator is denoted by D0 and the duty ratios of the first to third IDTs are respectively denoted by D1 to D3, the duty ratio D0 is between the highest of the duty ratios D1 to D3 and the lowest of the duty ratios D1 to D3.

19 Claims, 5 Drawing Sheets

(51) Int. Cl.
  *H03H 9/05* (2006.01)
  *H03H 9/10* (2006.01)
  *H03H 9/145* (2006.01)

(52) U.S. Cl.
  CPC .......... *H03H 9/14582* (2013.01); *H03H 9/64* (2013.01); *H03H 9/6436* (2013.01)

(58) Field of Classification Search
  USPC ........................................................ 333/195
  See application file for complete search history.

(56) References Cited

U.S. PATENT DOCUMENTS

| | | |
|---|---|---|
| 2003/0001695 A1 | 1/2003 | Nakamura et al. |
| 2005/0212621 A1* | 9/2005 | Takamine ............ H03H 9/0038 333/195 |
| 2006/0158062 A1* | 7/2006 | Aoki ........................ H03H 3/08 310/313 B |
| 2008/0258846 A1* | 10/2008 | Kando ................. H03H 9/0222 333/195 |
| 2011/0095845 A1* | 4/2011 | Fujiwara ................ H03H 9/725 333/133 |
| 2011/0156842 A1 | 6/2011 | Takamine |
| 2011/0187479 A1 | 8/2011 | Takamine |

FOREIGN PATENT DOCUMENTS

| | | |
|---|---|---|
| JP | 4525861 B2 | 8/2010 |
| JP | 2013-229641 A | 11/2013 |
| WO | 2010/001534 A1 | 1/2010 |
| WO | 2010/035372 A1 | 4/2010 |
| WO | 2010/061496 A1 | 6/2010 |

\* cited by examiner

ELASTIC WAVE DEVICE

CROSS REFERENCE TO RELATED APPLICATIONS

This application claims the benefit of priority to Japanese Patent Application No. 2014-119580 filed on Jun. 10, 2014 and is a Continuation application of PCT Application No. PCT/JP2015/062398 filed on Apr. 23, 2015. The entire contents of each application are hereby incorporated herein by reference.

BACKGROUND OF THE INVENTION

1. Field of the Invention

The present invention relates to an elastic wave device including a longitudinally-coupled resonator surface acoustic wave filter and a parallel trap.

2. Description of the Related Art

Longitudinally-coupled resonator elastic wave filter devices are used, for example, as RF filters of mobile terminals. Japanese Patent No. 4525861 describes an elastic wave filter device that includes a longitudinally-coupled resonator surface acoustic wave filter section, including narrow-pitch portions, and a parallel trap. By making the number of electrode fingers in the narrow-pitch portions differ from each other, the frequency position of the first resonant mode is adjusted to increase the sharpness of filter characteristics. Moreover, the sharpness of filter characteristics is further increased by positioning the resonant frequency of the parallel trap in an attenuation band.

With the elastic wave filter device described in Japanese Patent No. 4525861, the resonant frequencies of the first resonant mode and the parallel trap tend to shift if the electrode finger width varies.

SUMMARY OF THE INVENTION

Preferred embodiments of the present invention provide an elastic wave device whose attenuation characteristics do not vary easily even if electrode finger width varies.

An elastic wave device according to a preferred embodiment of the present invention includes a piezoelectric substrate, a longitudinally-coupled resonator surface acoustic wave filter including first to third IDTs that are arranged on the piezoelectric substrate in order in an elastic-wave propagation direction, and a parallel trap that is connected between one end of the longitudinally-coupled resonator surface acoustic wave filter and a ground potential and that includes a surface acoustic wave resonator. The longitudinally-coupled resonator surface acoustic wave filter is asymmetric with respect to a central axis of the second IDT, the central axis extending in a direction perpendicular to the elastic-wave propagation direction on the piezoelectric substrate. When a duty ratio of the surface acoustic wave resonator of the parallel trap is denoted by D0 and duty ratios of the first to third IDTs of the longitudinally-coupled resonator surface acoustic wave filter are respectively denoted by D1 to D3, the duty ratio D0 is between the highest of the duty ratios D1 to D3 and the lowest of the duty ratios D1 to D3.

In a particular aspect of an elastic wave device according to a preferred embodiment of the present invention, the duty ratio D2 is lower than the duty ratio D1 and the duty ratio D3.

In another particular aspect of an elastic wave device according to a preferred embodiment of the present invention, the duty ratio D0 is within a range of a composite duty ratio of the duty ratios D1 to D3 of about ±0.02, for example.

In still another particular aspect of an elastic wave device according to a preferred embodiment of the present invention, the composite duty ratio is a mean value of the duty ratio D2 and a mean of the duty ratios D1 and D3.

In still another particular aspect of an elastic wave device according to a preferred embodiment of the present invention, the composite duty ratio is an arithmetic mean of the duty ratios D1 to D3 of the first to third IDTs.

In still another particular aspect of an elastic wave device according to a preferred embodiment of the present invention, the composite duty ratio is $\{(D1+D3)/2+D2\}/2$.

In a different particular aspect of an elastic wave device according to a preferred embodiment of the present invention, the elastic wave device further includes a package member that is joined onto the piezoelectric substrate so as to define a hollow portion that the first to third IDTs and an IDT of the surface acoustic wave resonator face.

In still another particular aspect of an elastic wave device according to a preferred embodiment of the present invention, the package member includes a support member and a cover member, the support member being stacked on the piezoelectric substrate and including an opening to define the hollow portion, the cover member being stacked on the support member.

With elastic wave devices according to preferred embodiments of the present invention, because the duty ratio of the surface acoustic wave resonator of the parallel trap and the duty ratios of the first to third IDTs of the longitudinally-coupled resonator surface acoustic wave filter are in the aforementioned specific range, variation of attenuation characteristics does not easily occur even if the electrode finger width varies.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

Figure 1:
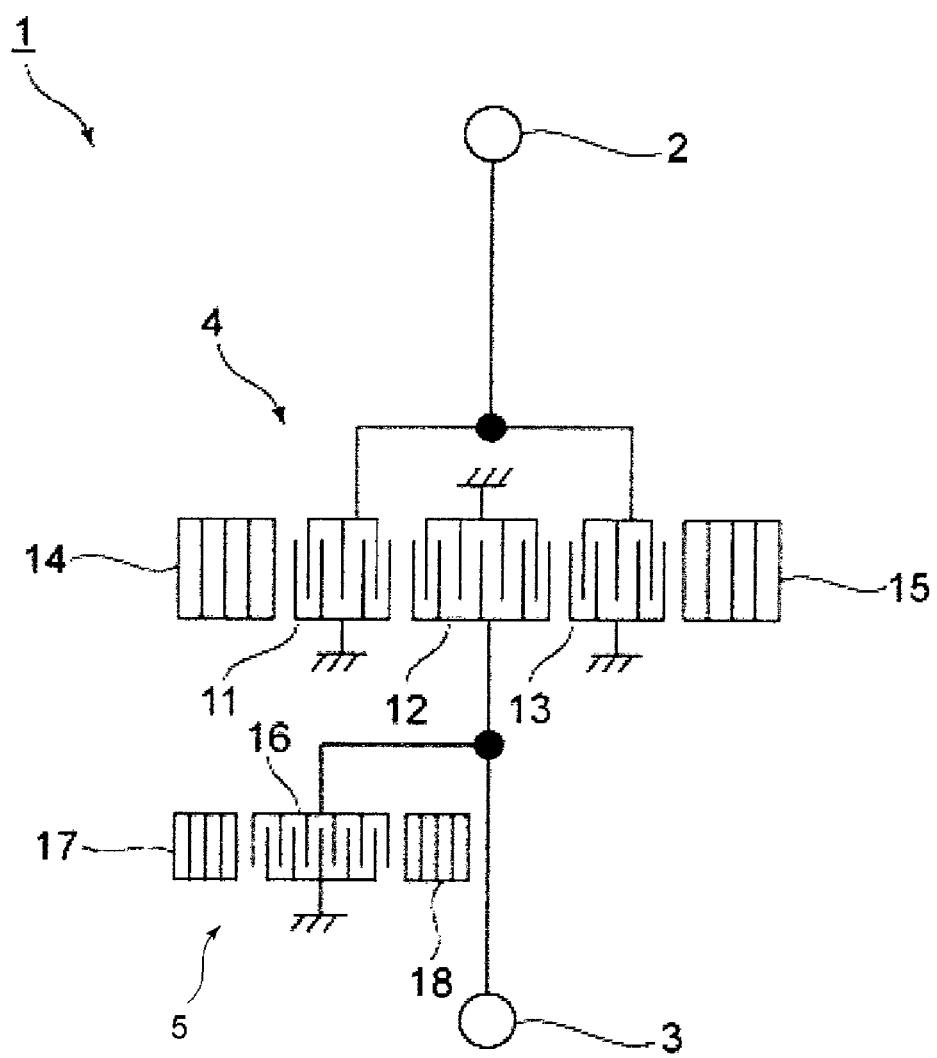
FIG. 1 is a schematic circuit diagram of an elastic wave device according to a first preferred embodiment of the present invention.

FIG. 1 is a schematic circuit diagram of an elastic wave device according to a first preferred embodiment of the present invention.

An elastic wave device 1 includes a piezoelectric substrate on which an electrode structure is provided as shown in the figure. In the elastic wave device 1, a longitudinally-coupled resonator surface acoustic wave filter 4 is connected between an input terminal 2 and an output terminal 3. The longitudinally-coupled resonator surface acoustic wave filter 4 includes first to third IDTs 11 to 13, which are arranged on the piezoelectric substrate in order in the surface-acoustic-wave propagation direction. Reflectors 14 and 15 are disposed on both sides, in the surface-acoustic-wave propagation direction, of a region in which the first to third IDTs 11 to 13 are disposed. Each of the first to third IDTs 11 to 13 includes an IDT electrode including first and second comb-shaped electrodes that interdigitate with each other in an intersecting-width direction. The first and second comb-shaped electrodes include first and second electrode fingers whose end portions, which differ from each other, are respectively joined to first and second busbars.

The longitudinally-coupled resonator surface acoustic wave filter 4 includes an unbalanced-unbalanced input-output terminals, although this is not a limitation. One end of each of the first and third IDTs 11 and 13 is connected to the input terminal 2. The other end of each of the first and third IDTs 11 and 13 is connected to a ground potential. One end of the second IDT 12 is connected to a ground potential. The other end of the second IDT 12 is connected to the output terminal 3.

The first to third IDTs 11 to 13 include narrow-pitch portions in regions where the IDTs are located adjacent to each other. The term "narrow-pitch portion" refers to a portion of an IDT in which the pitch of electrode fingers is narrower than that in the remaining portion, that is, the body of the IDT.

In FIG. 1, the narrow-pitch portions are disposed in a region where the first IDT 11 and the second IDT 12 are located adjacent to each other and in a region where the second IDT 12 and the third IDT 13 are located adjacent to each other. To be specific, the narrow-pitch portions are disposed on both sides of each of the regions where the first to third IDTs 11 to 13 are located adjacent to each other.

The longitudinally-coupled resonator surface acoustic wave filter 4 is asymmetric with respect to a central axis of the second IDT 12, the central axis extending along a surface of the piezoelectric substrate in a direction perpendicular or substantially perpendicular to the surface-acoustic-wave propagation direction. To be more specific, the number of electrode fingers, the pitch of electrode fingers, and the like differ between a portion of the filter 4 on one side of the central axis of the second IDT 12, that is, on the first IDT 11 side, and a portion of the filter 4 on the other side of the central axis of the second IDT 12, that is, on the third IDT 13 side. Thus, these portions of the filter 4 are asymmetric. Due to the asymmetry, the frequency of the first resonant mode is able to be adjusted. That is, as described in Japanese Patent No. 4525861, the resonant frequency of the first resonant mode can be located in an attenuation band near the passband. Thus, the sharpness of filter characteristics can be increased. The frequency of the first resonant mode can be adjusted by changing the structure of electrode fingers.

A surface acoustic wave resonator 5 is connected between the output of the second IDT 12 and a ground potential to define a parallel trap.

The surface acoustic wave resonator 5 includes an IDT 16 and reflectors 17 and 18 that are disposed on both sides of the IDT 16 in the surface-acoustic-wave propagation direction.

The impedances of the input terminal 2 and the output terminal 3 of the elastic wave device 1 preferably are both about 50Ω, for example. The elastic wave device 1 preferably is used as a receive filter for UMTS band 2. The transmission frequency band of UMTS band 2 is 1850-1910 MHz, and the receiving frequency band of UMTS band 2 is 1930-1990 MHz.

In the present preferred embodiment, a 40°±5°-rotated Y-cut X-propagation LiTaO$_3$ substrate is preferably used as the piezoelectric substrate. The aforementioned electrode structure preferably is formed on the piezoelectric substrate by using aluminum.

The surface acoustic wave resonator 5 is used to increase the attenuation of frequencies outside the passband of the longitudinally-coupled resonator surface acoustic wave filter 4. The resonant frequency of the surface acoustic wave resonator 5 is lower than the lower limit frequency of the passband of the filter 4, and the anti-resonant frequency of the resonator 5 is within the passband of the filter 4.

In the elastic wave device 1 according to the present preferred embodiment, the duty ratios of the first to third IDTs 11 to 13 of the longitudinally-coupled resonator surface acoustic wave filter 4 and the duty ratio of the IDT of the surface acoustic wave resonator 5 of the parallel trap have the following relationship. The term "electrode finger width" refers to the dimension of an electrode finger in the elastic-wave propagation direction. The term "duty ratio (metallization ratio)" refers to the ratio of the electrode finger width to the sum of the electrode finger width and the distance between adjacent electrode fingers in the elastic-wave propagation direction.

Let D0 denote the duty ratio of the IDT of the surface acoustic wave resonator 5. Let D1, D2 and D3 respectively denote the duty ratios of the first to third IDTs 11 to 13. In the present preferred embodiment, the duty ratio D0 is between the highest of the duty ratios D1 to D3 and the lowest of the duty ratios D1 to D3. Thus, as can be seen from experimental examples described below, the attenuation characteristics do not deteriorate easily, even if the electrode finger width, which is the dimension of an electrode finger in the width direction, varies.

Preferably, the duty ratio D2 is lower than the duty ratio D1 and the duty ratio D3. With such a structure, even if the electrode finger width varies, deterioration of attenuation characteristics due to variation of the frequency of the first resonant mode is able to be effectively reduced or prevented. Further preferably, the duty ratio D0 is within a range of a composite duty ratio of the duty ratios D1 to D3 of about ±0.02, for example. In this case, deterioration of attenuation characteristics due to variation of the electrode finger width is able to be further effectively reduced or prevented.

The composite duty ratio may be a mean value of the duty ratio D2 of the second IDT and a mean of the duty ratio D1 of the first IDT and the duty ratio D3 of the third IDT. The composite duty ratio may be the arithmetic mean of the duty ratios D1 to D3. Further preferably, the composite duty ratio is $\{(D1+D3)/2+D2\}/2$.

The longitudinally-coupled resonator surface acoustic wave filter 4 may be structured so as to have an unbalanced-balanced function. That is, the longitudinally-coupled resonator surface acoustic wave filter 4 may include three IDTs arranged in the surface-acoustic-wave propagation direction and reflectors disposed on both sides of the three IDTs.

Figure 2:
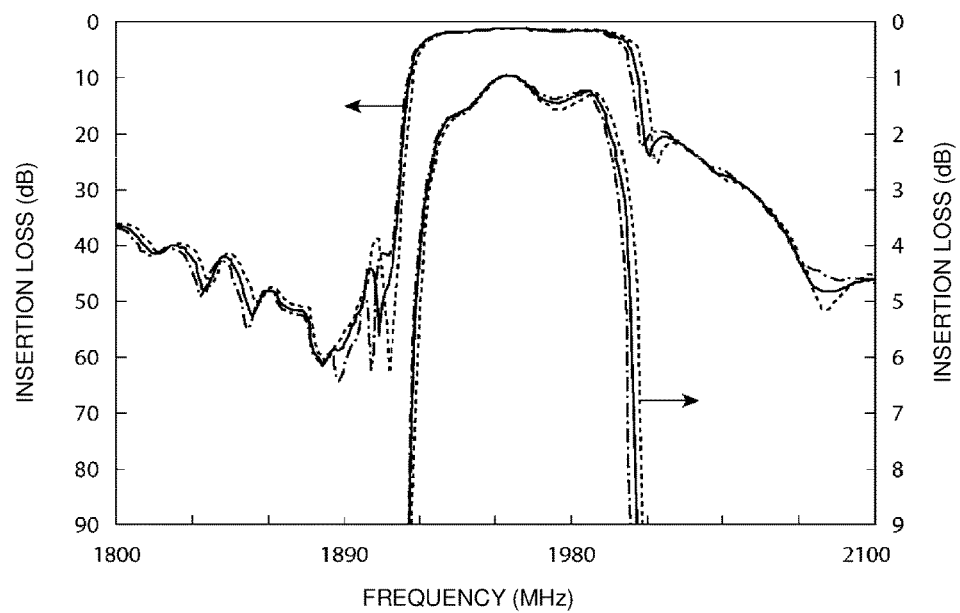
FIG. 2 is a graph of the attenuation frequency characteristics of an elastic wave device according to a comparative example, showing a case where the electrode finger width is a design value, a case where the width is the design value−0.03 μm, and a case where the width is the design value+0.03 μm.

Referring to FIGS. 2 to 8, an advantage of the present preferred embodiment, in that deterioration of attenuation characteristics does not easily occur even if the electrode finger width varies, will be described. FIG. 2 shows the attenuation frequency characteristics of an elastic wave device according to a comparative example, as described below. FIGS. 3 to 7 show the attenuation frequency characteristics of the elastic wave device according to the present preferred embodiment.

A non-limiting example of an elastic wave device according to a preferred embodiment of the present invention was made so as to have the following specifications.

Longitudinally-Coupled Resonator Surface Acoustic Wave Filter 4

Let $\lambda I$ denote a wavelength that is determined by the electrode finger pitch of the bodies of the first to third IDTs 11 to 13, excluding the narrow-pitch portions.

Intersecting width: $33.2\lambda I$

Electrode film thickness: $0.092\lambda I$

The number of electrode fingers of the first to third IDTs: the number of electrode fingers of the first IDT 11=44, the number of electrode fingers of the second IDT 12=52, and the number of electrode fingers of the third IDT 13=44

The number of electrode fingers of each of the reflectors 14 and 15: 61

The number of electrode fingers in narrow-pitch portions: the number of electrode fingers of the narrow-pitch portion of the first IDT 11=8, the number of electrode fingers of the narrow-pitch portion of the second IDT 12 on the first IDT 11 side=9, the number of electrode fingers of the narrow-pitch portion of the second IDT 12 on the third IDT 13 side=7, and the number of electrode fingers of the narrow-pitch portion of the third IDT 13=6

The duty ratios of the first to third IDTs 11 to 13: the duty ratio D1 of the first IDT 11=0.68, the duty ratio D2 of the second IDT 12=0.62, and the duty ratio D3 of the third IDT 13=0.68

The duty ratio of narrow-pitch portions: the duty ratios of all narrow-pitch portions were 0.62.

The duty ratio of the reflectors 14 and 15: 0.68

Surface Acoustic Wave Resonator 5

One end of the surface acoustic wave resonator 5, to define a parallel trap, was connected to a signal wire and the other end of the resonator was connected to a grounded potential, and the resonant frequency of the resonator was lower than the lower limit of the passband of the longitudinally-coupled resonator surface acoustic wave filter. As the surface acoustic wave resonator 5, a surface acoustic wave resonator having the following properties was used.

Let $\lambda I2$ denote a wavelength that is determined by the electrode finger pitch of the IDT.

Intersecting width: $20.9\lambda I2$

The number of electrode fingers of the IDT electrode=155

The number of electrode fingers of each of the reflectors=30

Duty ratio=0.65

Electrode film thickness=$0.093\lambda I2$

As the duty ratios of the first to third IDTs 11 to 13, the duty ratios of the bodies of the IDTs 11 to 13, excluding the narrow-pitch portions, are preferably used. Accordingly, in the surface acoustic wave device, the duty ratios of the parallel trap and the first to third IDTs were respectively D0=about 0.65, D1=about 0.68, D2=about 0.62, and D3=about 0.68, for example. Accordingly, D0 was between a value of about 0.68, which was the highest of D1 to D3, and a value of about 0.62, which was the lowest of D1 to D3, for example.

Typically, surface acoustic wave resonators have been structured so as to have a duty ratio in the range of about 0.50 to about 0.60, for example, in order to improve the resonance characteristics. Typically, in longitudinally-coupled resonator elastic wave filters, IDTs of surface acoustic wave resonators have been structured so as to have a duty ratio of about 0.6 or higher, for example, in order to reduce the wiring resistance. However, regarding a structure including a longitudinally-coupled resonator elastic wave filter and a parallel trap, in which the longitudinally-coupled resonator elastic wave filter includes three IDTs and is asymmetric with respect to the central axis of a middle one of the IDTs, by determining the relationship between the duty ratios to be in the range according to the present preferred embodiment, it is possible to significantly reduce or prevent deterioration of attenuation characteristics due to variation of the positional relationship between the frequency of the first resonant mode and the resonant frequency of the parallel trap caused by variation of the electrode finger width.

For comparison, an elastic wave device, which was the same as the above-described preferred embodiment except that the duty ratios D0, D1, D2 and D3 were set as follows, was made as a comparative example.

Comparative Example

D0=0.60, D1=0.68, D2=0.68, and D3=0.68.

FIG. 2 is a graph of the attenuation frequency characteristics of the elastic wave device according to the comparative example, showing a case where the electrode finger width of the IDT electrode is a design value Wd, a case where the width is Wd−about 0.03 µm, and a case where the width is Wd+about 0.03 µm. The solid lines represent the result in the case where the electrode finger width is the design value Wd, and the broken lines and the chain lines respectively represent the results in the case where the width is Wd−0.03 µm and the case where the width is Wd+0.03 µm. As can be seen from FIG. 2, with the comparative example, when the electrode finger width of the IDT electrode varies by ±0.03 µm, attenuation in the 1850-1910 MHz band, that is, the passband of the transmission frequencies deteriorates considerably.

Figure 3:
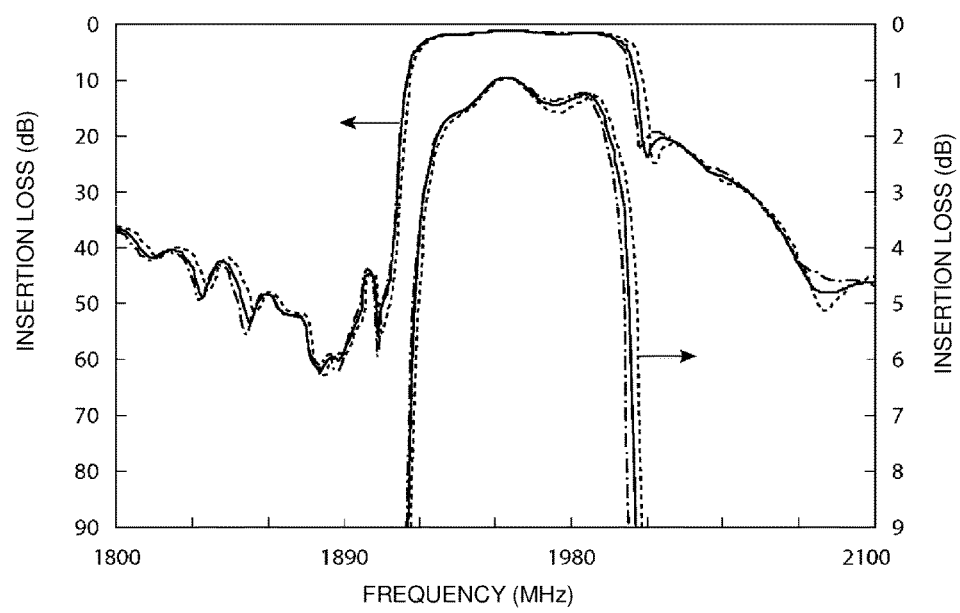
FIG. 3 is a graph of the attenuation frequency characteristics of an elastic wave device according to a preferred embodiment of the present invention including a longitudinally-coupled resonator surface acoustic wave filter having a composite duty ratio of about 0.65 and a parallel trap having a duty ratio of about 0.65, showing a case where the electrode finger width is a design value, a case where the width is the design value of about −0.03 μm, and a case where the width is the design value of about +0.03 μm.

FIG. 3 is a graph of the attenuation frequency characteristics of the elastic wave device according to a preferred embodiment of the present invention, showing a case where the electrode finger width of the IDT electrode is a design value Wd, a case where the width is Wd−about 0.03 µm, and a case where the width is Wd+about 0.03 µm, for example. The solid lines represent the result in the case where the electrode finger width is the design value Wd, the broken lines represent the result in the case where the width is Wd−about 0.03 µm, and the chain lines represent the result in the case where the width is Wd+about 0.03 µm, for example.

As can be seen by comparing FIG. 3 with FIG. 2, with the present preferred embodiment, deterioration of attenuation in the 1850-1910 MHz band is effectively reduced or prevented, even if the electrode finger width varies. To be more specific, it can be seen that, for the width variation of about ±0.03 µm, variation of attenuation in the aforementioned frequency band is about 1 dB or less, for example. Accordingly, deterioration of attenuation is effectively reduced or prevented, even if the electrode finger width varies.

Figure 4:
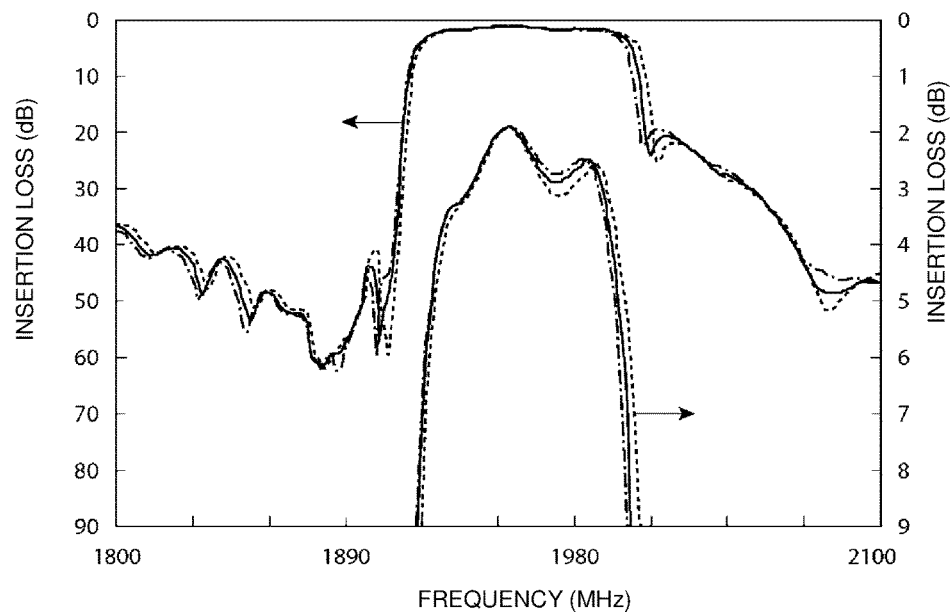
FIG. 4 is a graph of the attenuation frequency characteristics of an elastic wave device according to a preferred embodiment of the present invention including a longitudinally-coupled resonator surface acoustic wave filter having a composite duty ratio of about 0.61 and a parallel trap having a duty ratio of about 0.65, showing a case where the electrode finger width is a design value, a case where the width is the design value of about −0.03 μm, and a case where the width is the design value of about +0.03 μm.
Figure 5:
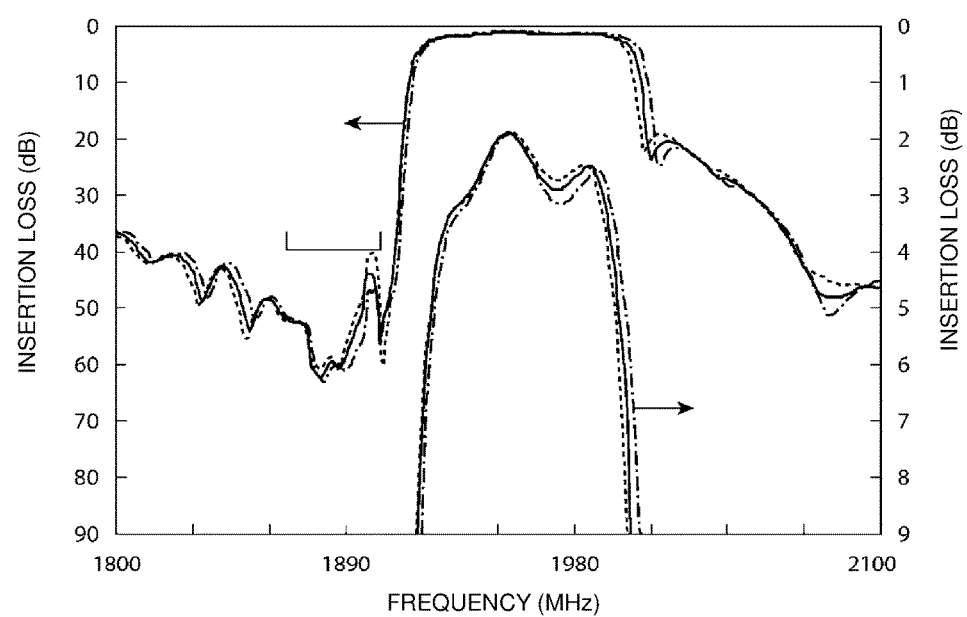
FIG. 5 is a graph of the attenuation frequency characteristics of an elastic wave device according to a preferred embodiment of the present invention including a longitudinally-coupled resonator surface acoustic wave filter having a composite duty ratio of about 0.69 and a parallel trap having a duty ratio of about 0.65, showing a case where the electrode finger width is a design value, a case where the width is the design value of about −0.03 μm, and a case where the width is the design value of about +0.03 μm.

The present inventor discovered that, as described above, deterioration of attenuation characteristics due to variation of the electrode finger width is able to be reduced or prevented by selectively determining the duty ratios of the first to third IDTs 11 to 13 of the longitudinally-coupled resonator surface acoustic wave filter 4 and the duty ratio of the IDT of the surface acoustic wave resonator 5 of the parallel trap. Then, the present inventor examined the characteristics by variously changing the duty ratios. In FIGS. 4 and 5, the duty ratio of the surface acoustic wave resonator 5 was about 0.65, and the composite duty ratio of the duty ratios D1 to D3 was about 0.61 or about 0.69, for example. Here, the composite duty ratio was calculated as $\{(D1+D3)/2+D2\}/2$.

To be more specific, in FIG. 4, the duty ratio D1 was about 0.62, the duty ratio D2 was about 0.60, the duty ratio D3 was about 0.62, and the composite duty ratio was about 0.61, for example.

In FIG. 5, the duty ratios D1, D2 and D3 were respectively about 0.70, about 0.68, and about 0.70, and the composite duty ratio was about 0.69, for example.

Also in FIGS. 4 and 5, the solid lines represent the result in the case where the electrode finger width is the design value Wd, the broken lines represent the result in the case where the width is Wd−about 0.03 µm, and the chain lines represent the result in the case where the width is Wd+about 0.03 µm. As can be seen by comparing FIGS. 4 and 5 with FIG. 3, in FIGS. 4 and 5, attenuation characteristics in the 1850-1910 MHz band vary comparatively widely due to variation of the electrode finger width.

That is, as can be seen from the attenuation frequency characteristics shown in FIGS. 4 and 5, when the composite duty ratio differs from the duty ratio D0 of the surface acoustic wave resonator by about 0.04 or more, the attenuation characteristics deteriorate to a certain extent.

Figure 6:
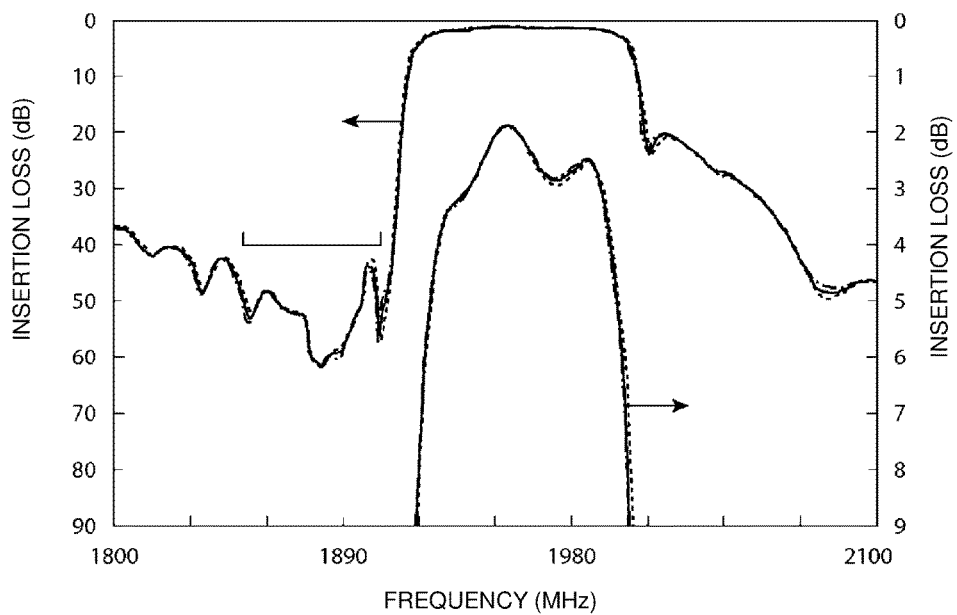
FIG. 6 is a graph of the attenuation frequency characteristics of an elastic wave device according to a preferred embodiment of the present invention including a longitudinally-coupled resonator surface acoustic wave filter having a composite duty ratio of about 0.63 and a parallel trap having a duty ratio of about 0.65, showing a case where the electrode finger width is a design value, a case where the width is the design value of about −0.03 μm, and a case where the width is the design value of about +0.03 μm.
Figure 7:
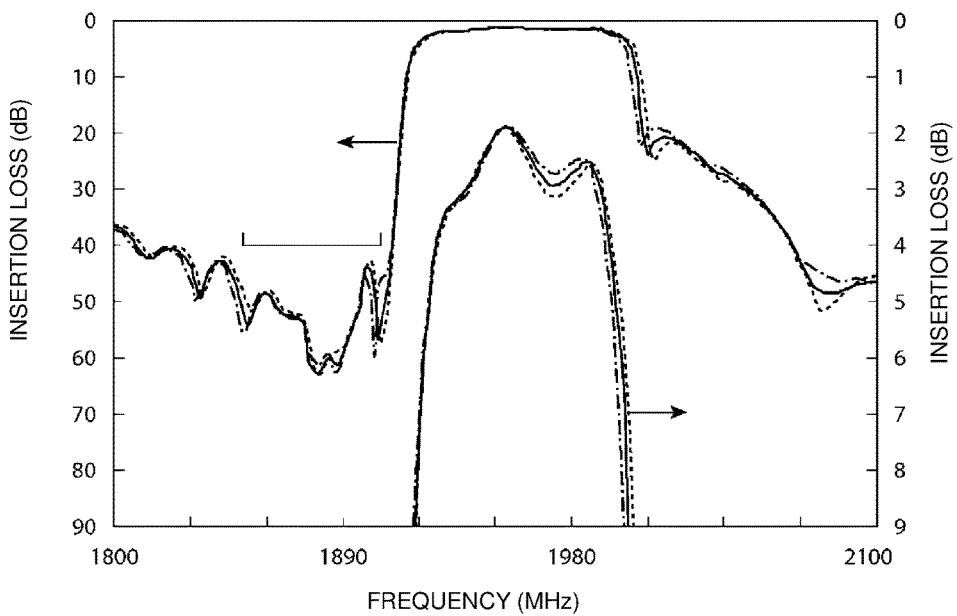
FIG. 7 is a graph of the attenuation frequency characteristics of an elastic wave device according to a preferred embodiment of the present invention including a longitudinally-coupled resonator surface acoustic wave filter having a composite duty ratio of about 0.67 and a parallel trap having a duty ratio of about 0.65, showing a case where the electrode finger width is a design value, a case where the width is the design value of about −0.03 μm, and a case where the width is the design value of about +0.03 μm.

In FIG. 6, the composite duty ratio was about 0.63, and the duty ratio D0 of the surface acoustic wave resonator 5 was about 0.65, for example. In FIG. 7, the composite duty ratio was about 0.67, and the duty ratio of the surface acoustic wave resonator was about 0.65, for example.

Also in FIGS. 6 and 7, the solid lines represent the result in the case where the electrode finger width is the design value Wd. The broken lines represent the result in the case where the width is the design value Wd−about 0.03 µm, and the chain lines represent the result in the case where the width is the design value Wd+about 0.03 µm, for example.

It can be seen that, in the attenuation frequency characteristics shown in FIG. 6, the attenuation characteristics in the 1850-1910 MHz band vary only negligibly even when the electrode finger width varies. Also in FIG. 7, variation of the attenuation characteristics in the 1850-1910 MHz band is smaller than those shown in FIGS. 4 and 5. That is, it can be seen that, in the case where the difference between the composite duty ratio and the duty ratio of the surface acoustic wave resonator 5 is about 0.02, variation of characteristics due to variation of the frequency of the first resonant mode, caused by variation of the electrode finger width, is very small, which is further preferable.

Figure 8:
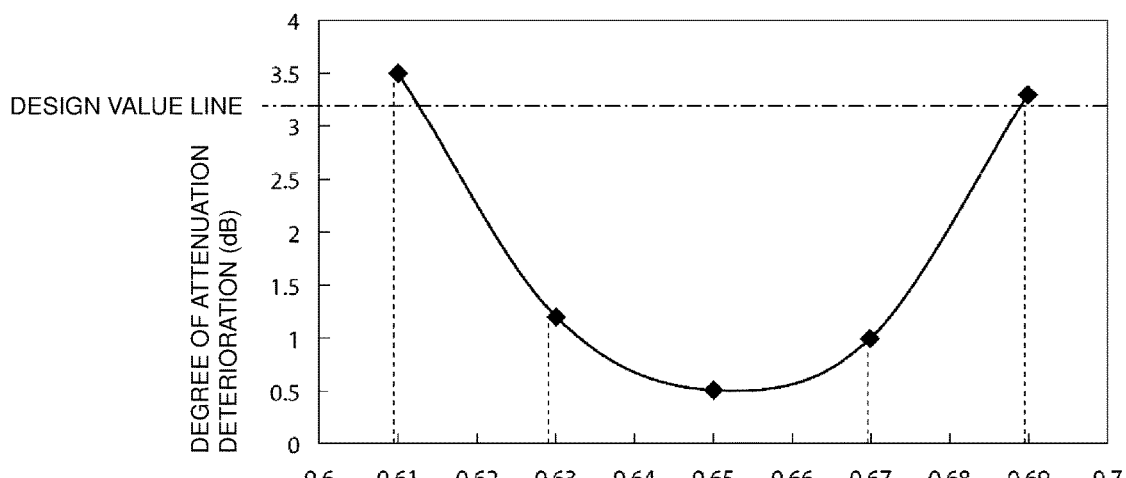
FIG. 8 is a graph showing the relationship between the composite duty ratio of a longitudinally-coupled resonator surface acoustic wave filter and the degree of attenuation deterioration.

While variously changing the composite duty ratio as described above, the degree of attenuation deterioration in the 1850-1910 MHz frequency band was measured. Here, the term "degree of attenuation deterioration" refers to the magnitude (dB) of deterioration of attenuation in the 1850-1910 MHz band. FIG. 8 shows the results.

As can be seen from FIG. 8, the degree of attenuation deterioration is the smallest when the composite duty ratio is about 0.65, and the degree of attenuation deterioration increases as the composite duty ratio deviates from about 0.65, for example. That is, it can be seen that the composite duty ratio is preferably close to about 0.65 because the duty ratio of the surface acoustic wave resonator 5 is about 0.65, for example. Moreover, it can be seen that the composite duty ratio is preferably in the range of about 0.63 to about 0.67 so that the degree of attenuation deterioration can be 1 dB or smaller, for example. Accordingly, the composite duty ratio D0 is preferably in the range of about ±0.02, as described above. In this case, variation of attenuation characteristics due to variation of the electrode finger width is able to be further effectively reduced or prevented, and deterioration of attenuation characteristics is able to be further reduced or prevented.

In the experimental examples described above, the composite duty ratio is calculated as $\{(D1+D3)/2+D2\}/2$. Alternatively, the composite duty ratio of the first to third IDTs 11 to 13 may be a mean value of the duty ratios of the first to third IDTs 11 to 13. In this case, the mean value is not particularly limited. The mean value may be the mean value of D2 and the mean value of D1 and D3, or may be the arithmetic mean of D1, D2 and D3.

Figure 9:
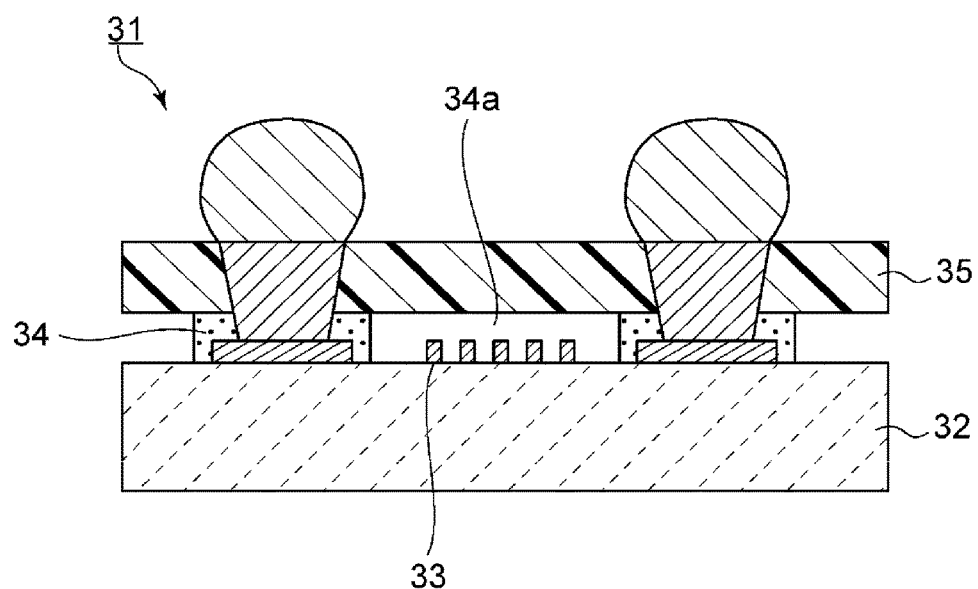
FIG. 9 is a schematic view of an elastic wave device according to a preferred embodiment of the present invention having a WLP structure.

The physical structure of an elastic wave device according to preferred embodiments of the present invention is not particularly limited. For example, preferred embodiments of the present invention can be appropriately used for an elastic wave device having a WLP structure shown in FIG. 9. In an elastic wave device 31 shown in FIG. 9, an electrode, such as an IDT electrode 33, is provided on a piezoelectric substrate 32. A support member 34, including an opening 34a, is stacked on the piezoelectric substrate 32. The IDT electrode 33 is exposed to the opening 34a. A cover member 35 is stacked on the support member 34 so as to seal the opening and to define a hollow portion, which is a sealed space. Thus, a package member, including the cover member 35 and the support member 34, is disposed on the piezoelectric substrate 32. Such a structure is known as a wafer level package structure (WLP structure).

An elastic wave device according to a preferred embodiment of the present invention may be an elastic wave device having the WLP structure described above. Preferred embodiments of the present invention can be used not only to an elastic wave device having the WLP structure but also to an elastic wave device in which a surface acoustic wave chip is mounted on a mount substrate by flip-chip bonding, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate;
   a longitudinally-coupled resonator surface acoustic wave filter including first to third IDTs that are arranged on the piezoelectric substrate in order in an elastic-wave propagation direction; and
   a parallel trap that is connected between one end of the longitudinally-coupled resonator surface acoustic wave filter and a ground potential and that includes a surface acoustic wave resonator; wherein
   the longitudinally-coupled resonator surface acoustic wave filter is asymmetric with respect to a central axis of the second IDT, the central axis extending in a direction perpendicular or substantially perpendicular to the elastic-wave propagation direction on the piezoelectric substrate;
   a duty ratio of the surface acoustic wave resonator of the parallel trap is D0 and duty ratios of the first to third IDTs of the longitudinally-coupled resonator surface acoustic wave filter are respectively D1 to D3, the duty ratio D0 is between a highest of the duty ratios D1 to D3 and a lowest of the duty ratios D1 to D3.

2. The elastic wave device according to claim 1, wherein the duty ratio D0 is within a range of a composite duty ratio of the duty ratios D1 to D3±about 0.02.

3. The elastic wave device according to claim 2, wherein the composite duty ratio is a mean value of the duty ratio D2 and a mean of the duty ratios D1 and D3.

4. The elastic wave device according to claim 2, wherein the composite duty ratio is an arithmetic mean of the duty ratios D1 to D3 of the first to third IDTs.

5. The elastic wave device according to claim 2, wherein the composite duty ratio is {(D1+D3)/2+D2}/2.

6. The elastic wave device according to claim 2, wherein the composite duty ratio is about 0.63 to about 0.67.

7. The elastic wave device according to claim 1, further comprising a package member that is joined onto the piezoelectric substrate to define a hollow portion that the first to third IDTs and an IDT of the surface acoustic wave resonator face.

8. The elastic wave device according to claim 7, wherein the package member includes a support member and a cover member, the support member being stacked on the piezoelectric substrate and including an opening to define the hollow portion, the cover member being stacked on the support member.

9. The elastic wave device according to claim 1, wherein the duty ratio D2 is lower than the duty ratio D1 and the duty ratio D3.

10. The elastic wave device according to claim 1, wherein reflectors are provided at both sides of the first to third IDTs.

11. The elastic wave device according to claim 1, further comprising unbalanced-unbalanced input output terminals.

12. The elastic wave device according to claim 1, wherein the first to third IDTs include narrow-pitch portions.

13. The elastic wave device according to claim 1, further comprising a surface acoustic wave resonator connected between the second IDT and a ground potential to define a parallel trap.

14. The elastic wave device according to claim 1, wherein the longitudinally-coupled resonator surface acoustic wave filter has an unbalanced-balanced function.

15. The elastic wave device according to claim 1, wherein D0 is equal to about 0.65, D1 is equal to about 0.68, D2 is equal to about 0.62, and D3 is equal to about 0.68.

16. The elastic wave device according to claim 1, wherein D0 is between about 0.62 and about 0.68.

17. The elastic wave device according to claim 1, wherein D0 is equal to about 0.62, D1 is equal to about 0.60, D2 is equal to about 0.62, and D3 is equal to about 0.61.

18. The elastic wave device according to claim 1, wherein D0 is equal to about 0.70, D1 is equal to about 0.68, D2 is equal to about 0.70, and D3 is equal to about 0.69.

19. The elastic wave device according to claim 1, wherein the elastic wave device has a wafer level package structure.

* * * * *